(12) United States Patent
Lee et al.

(10) Patent No.: US 11,709,293 B2
(45) Date of Patent: Jul. 25, 2023

(54) ELECTRONIC APPARATUS

(71) Applicant: Samsung Display Co., Ltd., Yongin-si (KR)

(72) Inventors: Jeoungsub Lee, Seoul (KR); Heonjung Shin, Hwaseong-si (KR); Hyun Joon Oh, Seongnam-si (KR); Daeho Yoon, Hanam-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 131 days.

(21) Appl. No.: 16/851,392

(22) Filed: Apr. 17, 2020

(65) Prior Publication Data

US 2020/0355852 A1 Nov. 12, 2020

(30) Foreign Application Priority Data

May 9, 2019 (KR) .......................... 10-2019-0054399

(51) Int. Cl.

| | |
|---|---|
| *G02B 1/14* | (2015.01) |
| *C09J 7/38* | (2018.01) |
| *B32B 7/02* | (2019.01) |
| *C08J 5/18* | (2006.01) |
| *C08J 7/04* | (2020.01) |
| *G02B 1/04* | (2006.01) |
| *G02F 1/1333* | (2006.01) |
| *G06F 1/16* | (2006.01) |

(Continued)

(52) U.S. Cl.
CPC .................. *G02B 1/14* (2015.01); *B32B 7/02* (2013.01); *C08J 5/18* (2013.01); *C08J 7/04* (2013.01); *C09J 7/38* (2018.01); *G02B 1/04* (2013.01); *G02F 1/13338* (2013.01); *G06F 1/1652* (2013.01); *G06F 3/044* (2013.01); *G09F 9/301* (2013.01); *H04M 1/0268* (2013.01); *C09J 2203/00* (2013.01); *G02F 2201/50* (2013.01); *G06F 2203/04102* (2013.01)

(58) Field of Classification Search
None
See application file for complete search history.

(56) References Cited

U.S. PATENT DOCUMENTS

| | | |
|---|---|---|
| 10,096,792 B2 | 10/2018 | Ahn et al. |
| 2017/0147117 A1* | 5/2017 | Song ................... G06F 3/0443 |

(Continued)

FOREIGN PATENT DOCUMENTS

| | | |
|---|---|---|
| KR | 10-1659239 B1 | 9/2016 |
| KR | 1020170024230 A | 3/2017 |

(Continued)

*Primary Examiner* — Anthony J Frost
(74) *Attorney, Agent, or Firm* — Cantor Colburn LLP

(57) ABSTRACT

An electronic apparatus includes an electronic panel foldable together with a window; and a first functional layer and a second functional layer each foldable together with the window and the electronic panel. The second functional layer is disposed farther from the window than the first functional layer, and has a thickness in a range from about 30 micrometers to about 50 micrometers and a modulus in a range from about 3 gigapascals to about 8 gigapascals, and the first functional layer is disposed closer to the window than the second functional layer, and has both a thickness equal to or greater than that of the second functional layer, and a modulus less than that of the second functional layer.

18 Claims, 7 Drawing Sheets

(51) Int. Cl.
    *G06F 3/044*     (2006.01)
    *G09F 9/30*     (2006.01)
    *H04M 1/02*     (2006.01)

(56) References Cited

U.S. PATENT DOCUMENTS

| | | |
|---|---|---|
| 2017/0321087 A1 | 11/2017 | Moon et al. |
| 2018/0112049 A1 | 4/2018 | Song et al. |
| 2018/0315953 A1* | 11/2018 | Hu .................. G02F 1/1333 |
| 2018/0375043 A1* | 12/2018 | Jung .................. H01L 51/0097 |
| 2019/0036048 A1 | 1/2019 | Lee et al. |
| 2019/0101784 A1 | 4/2019 | Shin et al. |

FOREIGN PATENT DOCUMENTS

| | | |
|---|---|---|
| KR | 1020180044189 A | 5/2018 |
| KR | 1020180096448 A | 8/2018 |

* cited by examiner

ELECTRONIC APPARATUS

This patent application claims priority to Korean Patent Application No. 10-2019-0054399, filed on May 9, 2019, and all the benefits accruing therefrom under 35 U.S.C. § 119, the entire contents of which are hereby incorporated by reference.

BACKGROUND

(1) Field

The present disclosure herein relates to an electronic apparatus, and more particularly, to a foldable electronic apparatus having improved reliability.

(2) Description of the Related Art

A bent or folded electronic apparatus has been actively developed. The flexible electronic apparatus includes an electronic panel such as a flexible display panel or a flexible touch panel, a window for covering the electronic panel, and various functional layers. The functional layers are disposed between the window and the electronic panel. The window and the functional layers are bendable or foldable in conjunction with the electronic panel.

Layers of the electronic apparatus have a relatively flexible property for being bent or folded. As having the flexible property, reliability with respect to a stress caused by bending may increase, but reliability with respect to an external impact may decrease.

SUMMARY

The present disclosure provides a foldable electronic apparatus having improved impact resistance and improved flexibility.

An embodiment of the invention provides an electronic apparatus including: an electronic panel which provides an image and is foldable with respect to a folding axis; a window which is foldable together with the electronic panel, with respect to the folding axis, and through which the image from the electronic panel is provided to outside the electronic apparatus; a first functional layer which is foldable together with window and the electronic panel, and disposed between the window and the electronic panel; and a second functional layer which is foldable together with the first functional layer, the window and the electronic panel, and disposed between the first functional layer and the electronic panel to be disposed farther from the window than the first functional layer. The second functional layer which is disposed farther from the window than the first functional layer, has a thickness in a range from about 30 micrometers to about 50 micrometers and a modulus in a range from about 3 gigapascals to about 8 gigapascals, and the first functional layer which is disposed closer to the window than the second functional layer, has both a thickness equal to or greater than that of the second functional layer, and a modulus less than that of the second functional layer.

In an embodiment, the first functional layer may have a thickness in a range from about 50 micrometers ($\mu m$) to about 100 $\mu m$, and the first functional layer may have a modulus that is variable according to temperature.

In an embodiment, the first functional layer may have a modulus of about 200 megapascals (MPa) or more at room temperature.

In an embodiment, the first functional layer may have a thickness in a range from about 50 $\mu m$ to about 75 $\mu m$, and the first functional layer may have a modulus of about 1000 MPa or more at a temperature of about −20° C.

In an embodiment, the first functional layer may have a thickness in a range from about 75 $\mu m$ to about 100 $\mu m$, and the first functional layer may have a modulus in a range from about 1000 MPa to about 1800 MPa at a temperature of about −20° C.

In an embodiment, the first functional layer may have a thickness in a range from about 50 $\mu m$ to about 75 $\mu m$, and the first functional layer may have a modulus of about 100 MPa or more at a temperature of about 80° C.

In an embodiment, the first functional layer may have a thickness in a range from about 75 $\mu m$ to about 100 $\mu m$, and the first functional layer may have a modulus of about 150 MPa or more at a temperature of about 80° C.

In an embodiment, the electronic apparatus may further include a cover panel facing the window with the electronic panel, the first functional layer and the second functional layer therebetween.

In an embodiment, each of the first and second functional layers may be optically clear.

In an embodiment, the window may include glass.

In an embodiment, the electronic apparatus may further include a coating layer on a top surface of the window.

In an embodiment of the invention, an electronic apparatus includes: an electronic panel which provides an image and is foldable with respect to a folding axis; a window which is foldable together with the electronic panel, with respect to the folding axis, and through which the image from the electronic panel is provided to outside the electronic apparatus; and a first functional layer and a second functional layer each of which is disposed between the electronic panel and the window and foldable together with the electronic panel and the window. The first functional layer is disposed closer to the window than the second functional layer, and has both a thickness equal to or greater than a thickness of the second functional layer, and a modulus less than a modulus of the second functional layer.

In an embodiment, the second functional layer may have a thickness in a range from about 30 $\mu m$ to about 50 $\mu m$, and the second functional layer may have a modulus in a range from about 3 gigapascals (GPa) to about 8 GPa.

In an embodiment, the first functional layer may have a thickness in a range from about 50 $\mu m$ to about 100 $\mu m$, and the first functional layer may have a modulus of about 200 MPa or more at room temperature.

In an embodiment, the first functional layer may have a thickness in a range from about 50 $\mu m$ to about 75 $\mu m$, and the first functional layer may have a modulus of about 1000 MPa or more at a temperature of about −20° C.

In an embodiment, the first functional layer may have a modulus of about 100 MPa or more at a temperature of about 80° C.

In an embodiment, the first functional layer may have a thickness in a range from about 75 $\mu m$ to about 100 $\mu m$, and the first functional layer may have a modulus in a range from about 1000 MPa to about 1800 MPa at a temperature of about −20° C.

In an embodiment, the first functional layer may have a modulus of about 150 MPa or more at a temperature of about 80° C.

In an embodiment, the first functional layer may include an elastomer.

In an embodiment, the window may include glass.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1A:
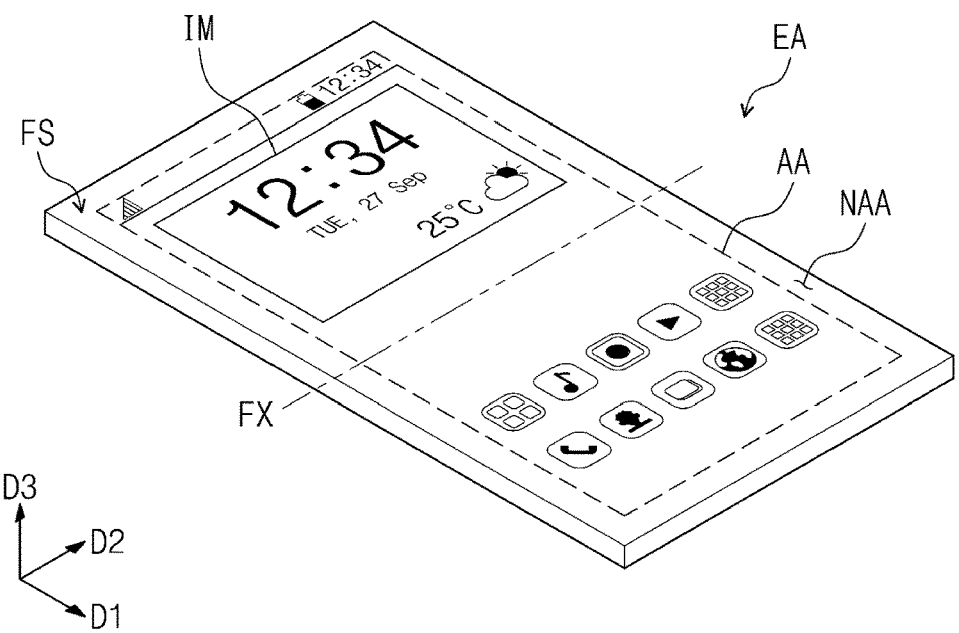
FIGS. 1A and 1B are perspective views illustrating an embodiment of an electronic apparatus.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. Also, in the figures, the thickness, ratio, and dimensions of components are exaggerated for clarity of illustration.

In this specification, it will also be understood that when one component (or region, layer, portion) is referred to as being related to another component such as being 'on', 'connected to', or 'coupled to' another component, it can be directly disposed/connected/coupled on/to the one component, or an intervening third component may also be present. In contrast, when one component (or region, layer, portion) is referred to as being related to another component such as being 'directly on', 'directly connected to', or 'directly coupled to' another component, no intervening third component is present.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 1B:
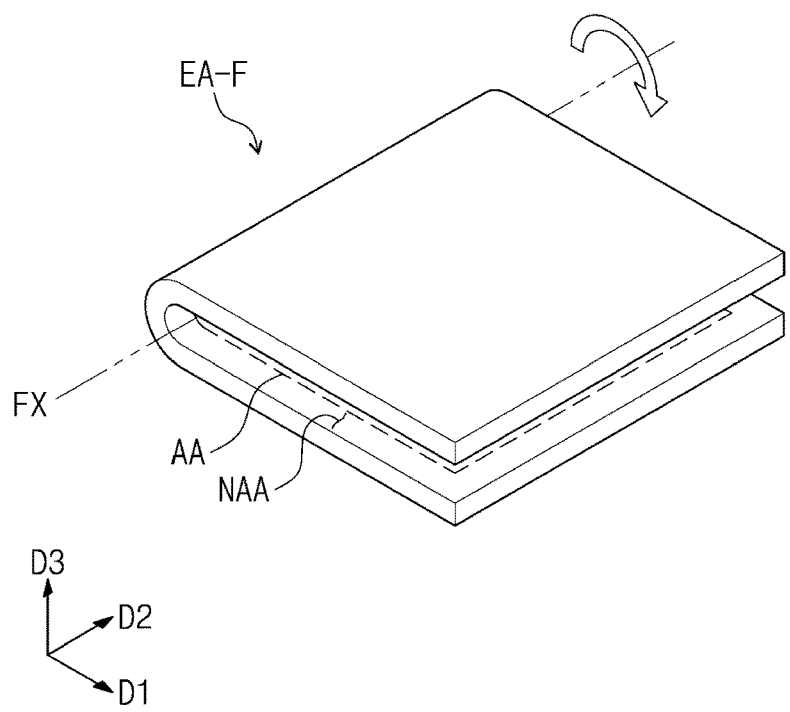

FIGS. 1A and 1B are perspective views illustrating an embodiment of an electronic apparatus EA. As illustrated in FIGS. 1A and 1B, an electronic apparatus EA may be deformed into various shapes. FIG. 1A is a perspective view illustrating the electronic apparatus EA which is in an unfolded shape or flat shape, and FIG. 1B is a perspective view illustrating an embodiment of an electronic apparatus EA-F which is in a folded shape or bent shape. The electronic apparatus EA-F in FIG. 1B has the same configuration (e.g., components, layers, etc.) as the electronic apparatus EA in FIG. 1A. Hereinafter, an embodiment of the invention will be described with reference to FIGS. 1A to 1B.

The electronic apparatus EA and EA-F is driven by receiving an electrical signal. The electronic apparatus EA may be provided in various types such as a touch sensing apparatus, a display apparatus, and a touch screen apparatus. However, the invention is not limited thereto. In the embodiment, the electronic apparatus EA is exemplarily described as a display apparatus for convenience of description.

The electronic apparatus EA may be deformed into various shapes by an external force applied to the electronic apparatus EA. The electronic apparatus EA may be unfolded, rolled or partially folded to provide a predetermined curved surface according to a force applied from outside the electronic apparatus EA. FIGS. 1A and 1B illustrate shapes according to external forces.

As illustrated in FIG. 1A, the electronic apparatus EA may be unfolded. The electronic apparatus EA which is unfolded (hereinafter, referred to as an unfolded electronic apparatus EA) may display an image IM on a front surface FS. The front surface FS may be disposed in a plane which is parallel to a plane defined by a first direction D1 and a second direction D2 which intersect each other. A normal direction to the front surface FS (e.g., perpendicular) is a third direction D3 which intersects the first direction D1 and the second direction D2. A thickness of the electronic apparatus EA and EA-F and/or components thereof is defined along the third direction D3. The front surface FS may include an active area AA and a peripheral area NAA.

The active area AA may display the image IM according to an electrical signal (e.g., a display area AA). The peripheral area NAA is disposed adjacent to the active area AA. The peripheral area NAA does not display the image IM (e.g., a non-display area NAA). A shape of the active area AA on a plane may be determined by the peripheral area NAA.

As illustrated in FIG. 1B, the electronic apparatus EA-F may be folded. The electronic apparatus EA-F which is folded (hereinafter, referred to as a folded electronic apparatus EA-F) may be folded with respect to a folding axis FX. The folding axis FX may be defined at various positions along the electronic apparatus EA and EA-F. In the embodiment, the folding axis FX is disposed at the front surface FS and lengthwise extends along the second direction D2. However, the invention is not limited thereto. In an embodiment, for example, the folding axis FX may be disposed below the electronic apparatus EA and EA-F such as at a rear surface opposite to the front surface FS along a thickness of the electronic apparatus EA and EA-F, may lengthwise extend along the first direction D1, or may lengthwise extend along a direction which is inclined or diagonal with respect to the first direction D1 and/or the second direction D2. The electronic apparatus EA and EA-F may be folded or unfolded along the defined folding axis FX. However, the invention is not limited thereto.

In the embodiment, the electronic apparatus EA is foldable about the folding axis FX (arrow indicated in FIG. 1B). Thus, the folded electronic apparatus EA-F may have a shape in which portions of the active area AA face each other at an inner area of the folded electronic apparatus EA-F, such as to be covered. The unfolded electronic apparatus EA provides information (e.g., image IM) to outside thereof through the active area AA and the folded electronic apparatus EA-F stably protects the active area AA by disposing portions thereof facing each other along the thickness of the folded electronic apparatus EA-F.

Figure 2A:
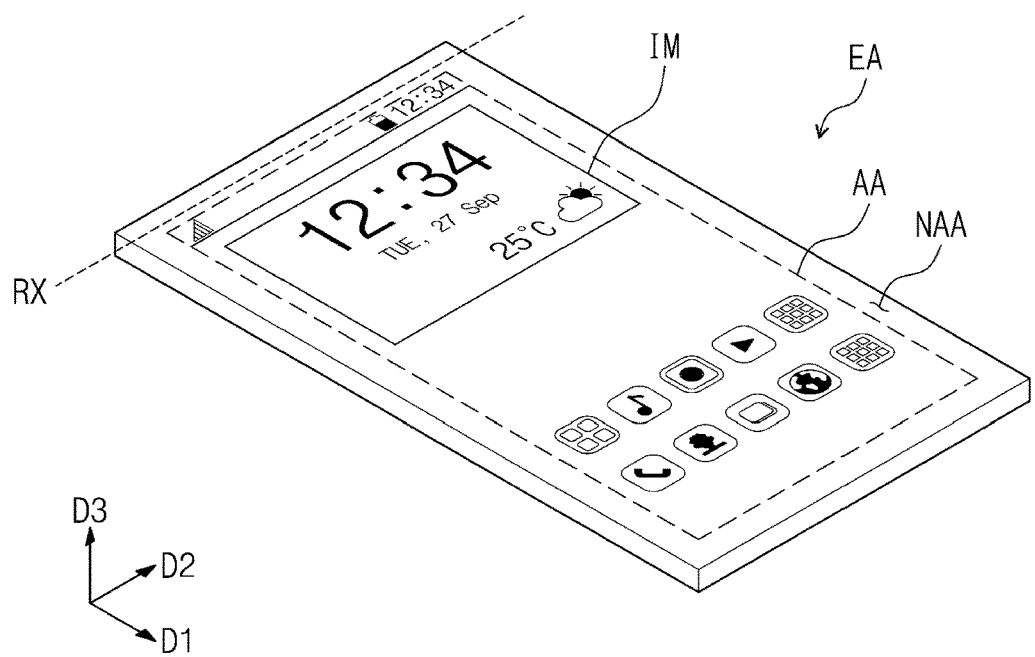
FIGS. 2A and 2B are perspective views illustrating another embodiment of an electronic apparatus.
Figure 2B:
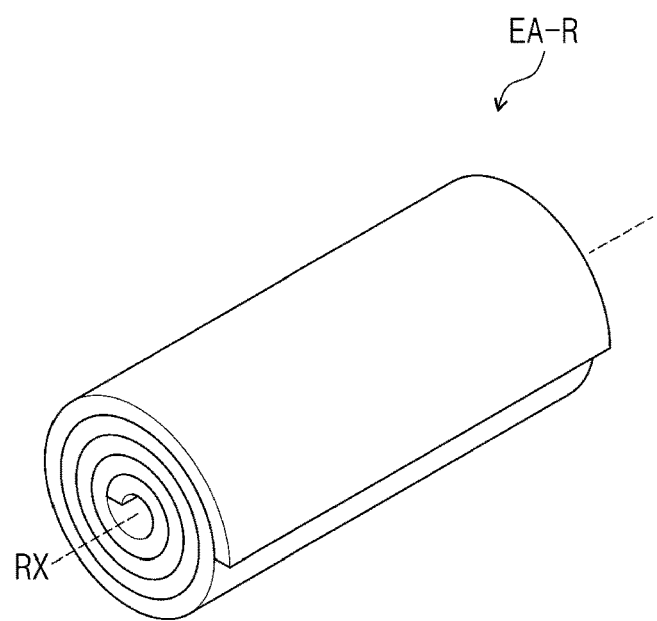

FIGS. 2A and 2B are perspective views illustrating another embodiment of an electronic apparatus EA and an electronic apparatus EA-R (e.g., electronic apparatus EA and EA-R). FIG. 2A is a perspective view illustrating an electronic apparatus EA which is unfolded, and FIG. 2B is a perspective view illustrating an electronic apparatus EA-R which is deformed to be rolled. The electronic apparatus EA-R in FIG. 2B has the same configuration as the electronic apparatus EA in FIG. 2A.

In the embodiment, the electronic apparatus EA may have substantially the same configuration as the electronic apparatus EA in FIG. 1A.

The electronic apparatus EA may be deformed to be disposed as the electronic apparatus EA-R (hereinafter, referred to as a rolled electronic apparatus EA-R). The electronic apparatus EA and EA-R may be rolled with respect to a rolling axis RX. The rolling axis RX may be defined in various positions along the electronic apparatus EA and EA-R. In the embodiment, the rolling axis RX is disposed at the front surface FS and on an area overlapping or corresponding to the peripheral area NAA.

The rolling axis RX is illustrated as an axis lengthwise extending along the second direction D2. However, the invention is not limited thereto. In an embodiment, for example, the rolling axis RX may be disposed below the front surface FS of the electronic apparatus EA and EA-R such as at a rear surface opposite to the front surface FS along a thickness of the electronic apparatus EA and EA-R, or may lengthwise extend along a diagonal direction with respect to the first direction D1 or the second direction D2 Although the electronic apparatus EA may be rolled or unrolled with respect to the defined rolling axis RX, the invention is not limited thereto.

In this embodiment, the electronic apparatus EA is rolled about the rolling axis RX. Thus, the rolled electronic apparatus EA-R may have a shape in which the active area AA is covered. The electronic apparatus EA and EA-R provides information to a user through the active area AA in the unrolled state and stably protects the active area AA in the rolled state.

Figure 3A:
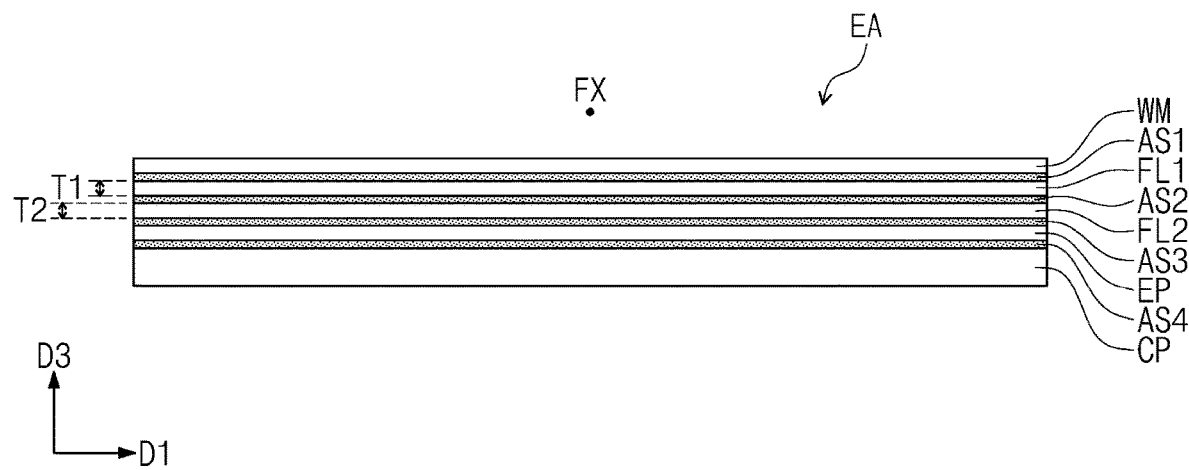
FIGS. 3A and 3B are schematic cross-sectional views illustrating an embodiment of an electronic apparatus.
Figure 3B:
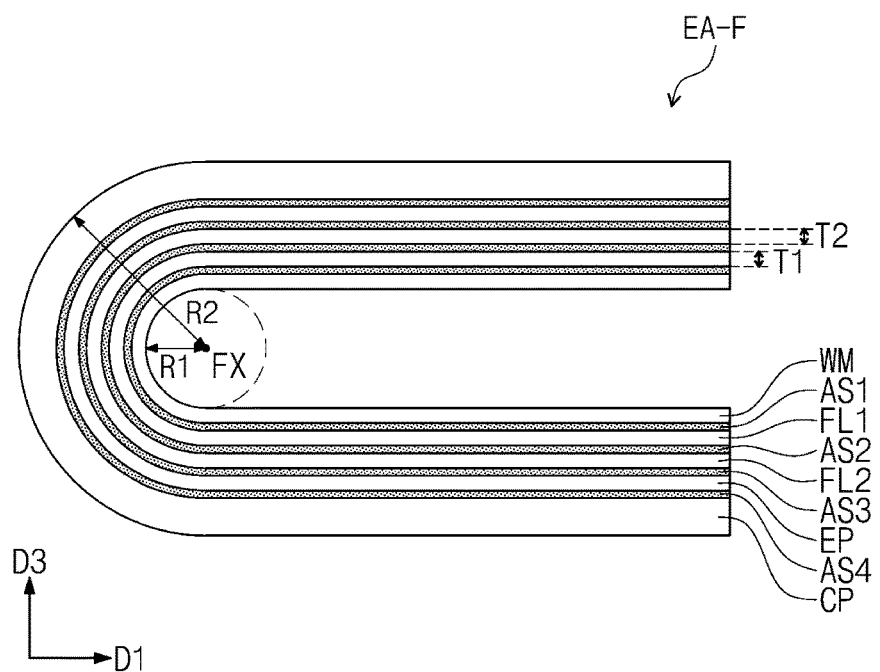
Figure 4A:
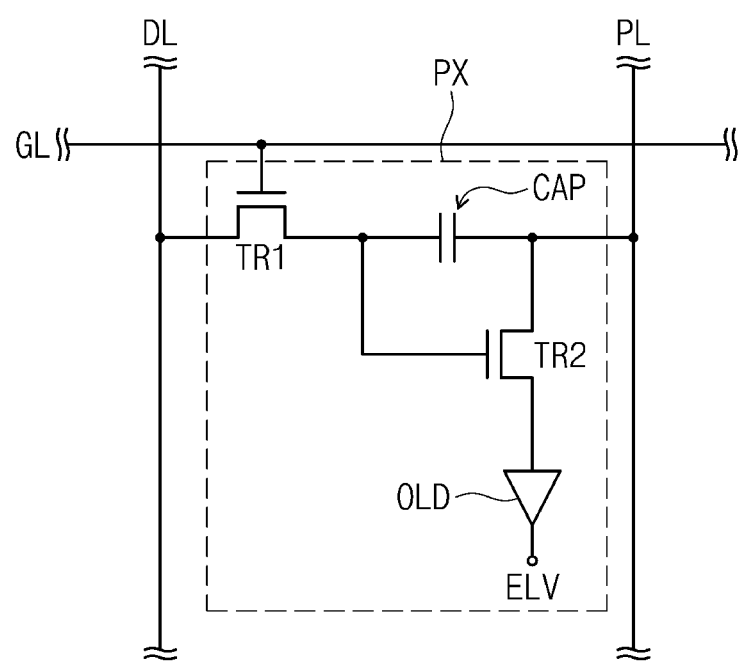
FIG. 4A is an equivalent circuit diagram illustrating an embodiment of the electronic apparatus in FIG. 3A.
Figure 4B:
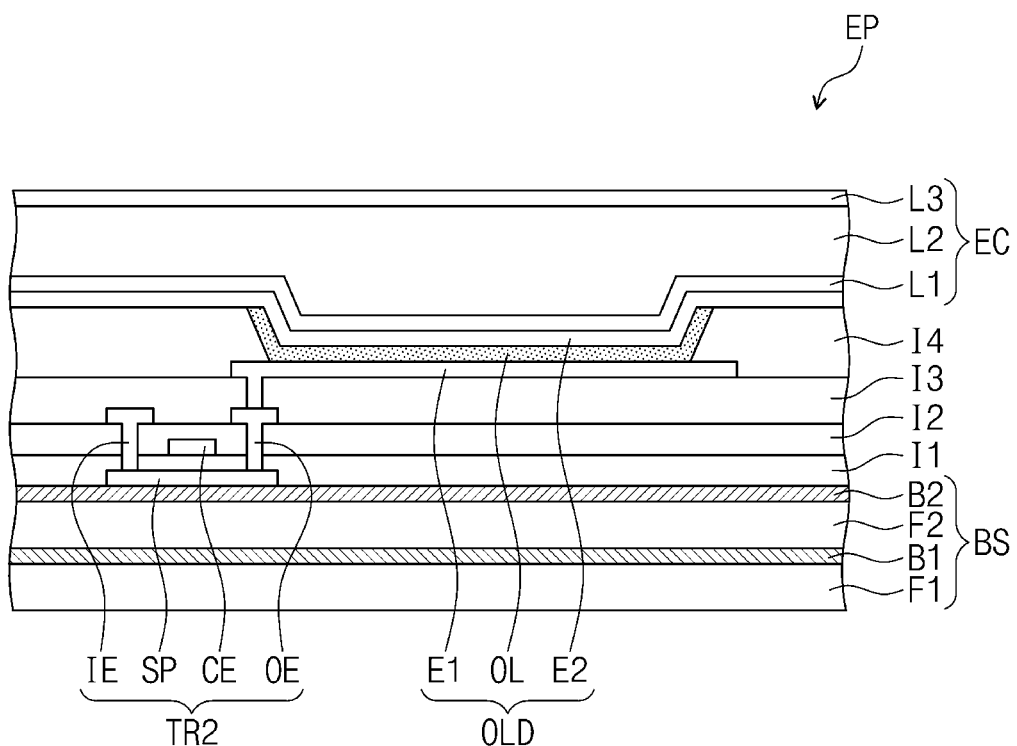
FIG. 4B is an enlarged cross-sectional view illustrating an embodiment of the electronic apparatus in FIG. 3A.

FIGS. 3A and 3B are schematic cross-sectional views illustrating an embodiment of an electronic apparatus EA and EA-F. FIG. 4A is an equivalent circuit diagram illustrating an embodiment of the electronic apparatus EA in FIG. 3A, and FIG. 4B is an enlarged cross-sectional view illustrating an embodiment of the electronic apparatus EA in FIG. 3A.

FIG. 3A is a cross-sectional view illustrating the electronic apparatus EA in FIG. 1A, and FIG. 3B is a cross-sectional view illustrating the electronic apparatus EA-F in FIG. 1B. Hereinafter, an embodiment of the invention will be described with reference to FIGS. 3A to 4B.

As illustrated in FIGS. 3A and 3B, the electronic apparatus EA and EA-F includes a window WM, a plurality of functional layers FL1 and FL2, an electronic panel EP, a lower cover CP, and a plurality of adhesive layers AS1, AS2, AS3, and AS4. The adhesive layers AS1, AS2, AS3, and AS4 may include first to fourth adhesive layers AS1, AS2, AS3, and AS4.

The window WM is disposed on the electronic panel EP. The window WM has a top surface that defines a front surface FS (refer to FIG. 1A) of the electronic apparatus EA. The window WM may be disposed on a display surface of the electronic panel EP, such as the front surface FS. The window WM may be optically clear. Thus, the image IM generated from the electronic panel EP may pass through the window WM and be easily recognized from outside the electronic apparatus EA.

The window WM has a flexible property. Thus, the window WM may be foldable or unfoldable with respect to the folding axis FX. In an embodiment, for example, the window WM may be a resin film including an organic material.

Alternatively, the window WM may be a glass substrate. Here, the window WM may have a thickness along the third direction D3, e.g., about 100 micrometers (μm) or less, to secure rigidity and flexibility at the same time. Thus, the window WM may have a flexible property while stably protecting components of the electronic apparatus EA.

The electronic panel EP has a flexible property. Thus, the electronic panel EP may be foldable or unfoldable with respect to the folding axis FX. The electronic panel EP may include a display panel DP (FIG. 5B) for generating and/or displaying an image, a sensing panel for detecting an external pressure thereto, or a combination thereof. In an embodiment, the electronic panel EP includes a display panel DP. Thus, the electronic panel EP displays the image IM (refer to FIG. 1A). The display panel DP may be one of a liquid crystal display panel, an organic light emitting display panel, an electrophoretic display panel, or an electrowetting display panel.

The electronic panel EP may include a pixel PX provided in plurality (e.g., a plurality of pixels PX). Each of the pixels PX may generate and/or emit light for realizing the image IM. In FIG. 4A, an equivalent circuit diagram of an embodiment of one of the pixels PX is simply illustrated for ease of description.

As illustrated in FIG. 4A, the pixel PX is electrically connected to a plurality of signal lines. In an embodiment, for example, the pixel PX receives a gate signal through a gate line GL (e.g., gate signal line GL) and a data signal through a data line DL (e.g., a data signal line DL). Also, the pixel PX may receive a first power voltage through a power line PL (e.g., a power signal line PL). The pixel PX may include a first transistor TR1, a second transistor TR2, a capacitor CAP, and a light emitting element OLD.

The first transistor TR1 outputs a data signal applied to the data line DL in response to a gate signal applied to the gate line GL. The first transistor TR1 may function as a switching element of the pixel PX. The capacitor CAP charges an electric charge quantity corresponding to a voltage difference between a signal provided through the first transistor TR1 and a power signal provided through the power line PL.

The second transistor TR2 is connected to the light emitting element OLD. The second transistor TR2 controls an electrical driving current flowing through the light emitting element OLD in correspondence with an electric charge quantity stored in the capacitor CAP.

The light emitting element OLD generates and/or emits light according to an electrical signal. The light emitting element OLD may be an organic light emitting element ("OLED") including an organic light emitting layer or a quantum dot light emitting element ("QD-LED") including a quantum dot. The light emitting element OLD generates and/or emits light during a turn-on period of the second transistor TR2.

In FIG. 4B, an enlarged cross-section of the electronic panel EP corresponding to a portion of the equivalent circuit diagram in FIG. 4A in which the second transistor TR2 and the light emitting element OLD are disposed. In the embodiment, the light emitting element OLD is exemplarily described as an organic light emitting element.

As illustrated in FIG. 4B, the electronic panel EP may include a base substrate BS, a second transistor TR2, a light emitting element OLD, a plurality of insulation layers I1, I2, I3, and I4, and an encapsulation layer EC.

The base substrate BS may have flexibility and an insulating property. Thus, the base substrate BS may be easily foldable or unfoldable with respect to the folding axis FX. In the embodiment, the base substrate BS may include a plurality of layers laminated along the third direction D3. In an embodiment, for example, the base substrate BS may include a first film layer F1, a first barrier layer B1, a second film layer F2, and a second barrier layer B2.

Each of the first film layer F1 and the second film layer F2 may include an organic material. In an embodiment, for example, each of the first film layer F1 and the second film layer F2 may include a resin such as polyimide ("PI"). The first film layer F1 and the second film layer F2 may include or be made of the same material as or different materials from each other.

Each of the first barrier layer B1 and the second barrier layer B2 may include an inorganic material. The first barrier layer B1 and the second barrier layer B2 may be disposed alternately with the first film layer F1 and the second film layer F2, within the base substrate BS. Thus, the first barrier layer B1 and the second barrier layer B2 may block moisture from permeating to the pixel PX through the first film layer F1 and the second film layer F2, and improve an adhesive force between elements or layers of the pixel PX and the base substrate BS. In the base substrate BS, the first barrier layer B1 and the second barrier layer B2 may be omitted, and the base substrate BS may include only one of the first film layer F1 and the second film layer F2. However, the invention is not limited thereto.

The second thin-film transistor TR2 is disposed on the base substrate BS. The second thin-film transistor TR2 includes a semiconductor pattern SP, a control electrode CE, an input electrode IE, and an output electrode OE.

The semiconductor pattern SP is disposed between the base substrate BS and the first insulation layer I1. The first insulation layer I1 is disposed on the base substrate BS to cover the semiconductor pattern SP. The first insulation layer I1 includes an organic layer and/or an inorganic layer. The first insulation layer I1 may include a plurality of thin-films.

The control electrode CE is connected to the first transistor TR1 and the capacitor CAP. The control electrode CE is disposed between the first insulation layer I1 and the second insulation layer I2. The control electrode CE overlaps the semiconductor pattern SP on a plane and is spaced apart from the semiconductor pattern SP along the thickness direction. The second insulation layer I2 is disposed on the first insulation layer I1 to cover the control electrode CE. The second insulation layer I2 includes an organic layer and/or an inorganic layer. The second insulation layer I2 may include a plurality of thin-films.

The input electrode IE and the output electrode OE are spaced apart from each other along the second insulation layer I2. The input electrode IE is connected to the capacitor CAP, and the output electrode OE is connected to the light emitting element OLD. The input electrode IE and the output electrode OE extend through the first insulation layer I1 and the second insulation layer I2 and are connected to opposing sides of the semiconductor pattern SP, respectively.

The light emitting element OLD is disposed on the third insulation layer I3. The third insulation layer I3 is disposed on the second insulation layer I2 to cover the input electrode IE and the output electrode OE of the second thin-film transistor TR2. The third insulation layer I3 includes an organic layer and/or an inorganic layer. The third insulation layer I3 may include a plurality of thin-films.

The light emitting element OLD includes a first electrode E1, a light emitting layer OL, and a second electrode E2. The light emitting element OLD excites an electric charge of the light emitting layer OL by a potential difference between the first electrode E1 and the second electrode E2 to generate and/or emit light.

The first electrode E1 is disposed on the third insulation layer I3. The first electrode E1 extends through the third insulation layer I3 and is connected to the second thin-film transistor TR2. The first electrode E1 receives a voltage corresponding to a data signal from the second thin-film transistor TR2.

The light emitting layer OL may be disposed on the first electrode E1, and disposed in an opening defined in the fourth insulation layer I4. The fourth insulation layer I4 is disposed on the third insulation layer I3 to provide the opening that exposes at least a portion of the first electrode E1 outside of the fourth insulation layer I4. The fourth insulation layer I4 includes an organic layer and/or an inorganic layer. The fourth insulation layer I4 may include a plurality of thin-films.

The second electrode E2 is disposed on the light emitting layer OL. The second electrode E2 covers the fourth insulation layer I4 and the light emitting layer OL. The second electrode E2 may be connected to a power terminal ELV (FIG. 4A) to receive a second power voltage that is different from the first power voltage.

Although not shown, at least one organic layer and/or at least one inorganic layer may be further disposed between the first electrode E1 and the light emitting layer OL and between the second electrode E2 and the light emitting layer OL. In an embodiment, the light emitting layer OL may be provided in plurality (e.g., a plurality of light emitting layers OL) spaced apart from each other along the base substrate BS. The light emitting element OLD may include various embodiments.

The encapsulation layer EC is disposed on the second electrode E2. The encapsulation layer EC may include a plurality of thin-films that are arranged in the third direction D3. In an embodiment, for example, the encapsulation layer EC includes a first film L1, a second film L2, and a third film L3 in order from the base substrate BS.

The first film L1 is disposed on the control electrode CE to cover the control electrode CE. The first film L1 may include an inorganic material. The first film L1 protects the second electrode E2 from external moisture or air. The second film L2 is disposed on the first film L1. The second film L2 may have a thickness that is relatively larger than that of the first film L1. The second film L2 may include an organic material. The second film L2 provides a flat top surface to planarize the first film L1 below.

The third film L3 is disposed on the second film L2 to cover the second film L2. The third film L2 encapsulates the second film L2. T electronic panel EP may include various components according to the type of electronic panel EP and/or display panel DP therein.

Referring to FIG. 3A again, the cover panel CP is disposed on a rear surface of the electronic panel EP. The cover panel CP may have a modulus or an elasticity greater than those of the electronic panel EP. The cover panel CP may reduce or effectively prevent an external impact applied from a lower side of the electronic apparatus EA from being transmitted to the electronic panel EP, to improve reliability of the electronic apparatus EA.

The functional layers FL1 and FL2 are disposed between the electronic panel EP and the window WM. The functional layers FL1 and FL2 may include a first functional layer FL1 and a second functional layer FL2.

The first functional layer FL1 may be a layer, which is closer to the window WM than the second functional layer FL2, among the functional layers FL1 and FL2. The first functional layer FL1 has a relatively low modulus. The first functional layer FL1 may have a first thickness T1. The first functional layer FL1 may have a different modulus based on a range of the first thickness T1 thereof.

The second functional layer FL2 may be a layer, which is closer to the electronic panel EP than first functional layer FL1, among the functional layers FL1 and FL2. The second functional layer FL2 has a relatively high modulus. The second functional layer FL2 may have a second thickness T2. The second thickness T2 may be equal to or less than the first thickness T1. In an embodiment, for example, the second functional layer FL2 may have a modulus in a range from about 3 gigapascals (GPa) to about 8 GPa and a second thickness T2 in a range from about 30 μm to about 50 μm.

Table 1 below shows results of a bending characteristic test of the electronic apparatus EA according to the thickness and modulus of the first functional layer FL1 of components of the electronic apparatus EA in FIG. 3A.

TABLE 1

| Temperature (Celsius, ° C.) | Modulus (megapascals MPa) | Thickness | | |
|---|---|---|---|---|
| | | 50 μm | 75 μm | 100 μm |
| Low temperature (−20° C.) | 800 | NG | NG | NG |
| | 1000 | OK | OK | OK |
| | 1200 | OK | OK | OK |
| | 1500 | OK | OK | OK |
| | 1800 | OK | OK | OK |
| | 2000 | OK | NG | NG |
| Room temperature (25° C.) | 100 | NG | NG | NG |
| | 200 | OK | OK | OK |
| | 350 | OK | OK | OK |
| | 650 | OK | OK | OK |
| | 800 | OK | OK | OK |
| | 1000 | OK | OK | OK |
| | 1500 | OK | OK | OK |
| High temperature (85° C.) | 50 | NG | NG | NG |
| | 100 | OK | OK | NG |
| | 150 | OK | OK | OK |
| | 300 | OK | OK | OK |
| | 400 | OK | OK | OK |
| | 600 | OK | OK | OK |
| | 800 | OK | OK | OK |

The results shown in Table 1 may be experimental results of embodiments of an electronic apparatus EA that are designed to have the same components as each other except for the thickness and modulus of the first functional layer FL1. The bending characteristic test may inspect whether interlayer delamination is generated when the corresponding embodiment of the electronic apparatus EA is folded with respect to a predetermined folding axis FX as illustrated in FIG. 1B. The term "OK" may represent a case in which the bending characteristics are secured, and the term "NG" may represent a case in which defects such as interlayer delamination or plastic deformation are generated.

Also, the moduli in the embodiment of the electronic apparatus EA may be values obtained by performing a tensile test for each temperature by using a universal test machine ("UTM"). Here, the tensile test is performed with a specimen having a width of about 10 millimeters (mm) and a length of about 50 mm, or a specimen having a width of about 25 mm and a length of about 100 mm, at a tensile speed of about 50 millimeters per minute (mm/min).

As shown in Table 1, the modulus of the first functional layer FL1 may be varied according to temperature. Under a relatively low temperature (−20° C.) condition, the first functional layer FL1 may have a modulus of about 1000

MPa when the first thickness T1 is about 50 μm to about 75 μm, and a modulus in a range from about 1000 MPa to about 1800 MPa when the first thickness T1 is about 75 μm to about 100 μm.

Also, under a room temperature (25° C.) condition, the first functional layer FL1 may have a modulus of about 200 MPa or more when the first thickness T1 is about 50 μm to about 100 μm. Also, under a relatively high temperature (85° C.) condition, the first functional layer FL1 may have a modulus of about 100 MPa or more when the first thickness T1 is about 50 μm to about 75 μm, and a modulus of about 150 MPa or more when the first thickness T1 is about 75 μm to about 100 μm.

The first functional layer FL1 may include an elastomer-based material (e.g., an elastomer) that satisfies the above-described thickness and modulus conditions. In an embodiment, for example, the first functional layer FL1 may include polyurethane, silicone, polyether block amide ("PEBA"), and copolyester elastomers ("COPE"), which satisfies the above-described thickness and modulus conditions.

As shown in Table 1, as the thickness (e.g., thickness T1 and T2) and modulus of each of the first functional layer FL1 and the second functional layer FL2 are controlled in a predetermined numerical range, the electronic apparatus EA may have improved bending characteristics. Thus, although the electronic apparatus EA further includes the plurality of functional layers FL1 and FL2, the electronic apparatus EA may secure flexibility.

Hereinafter, an impact resistance of the electronic apparatus EA will be described with reference to Table 2 below. The Table 2 below includes results of an impact resistance test between embodiments and comparative examples.

that of each of the First to Second embodiments and the First to Third comparative examples. In the Reference embodiment, the first functional layer FL1 is designed to have a thickness of about 50 μm. In case of the Reference embodiment, although the bending characteristics are excellent, the impact resistance has a lowest value of about 4 centimeters (cm).

The First and Second comparative examples may include the first functional layer FL1 that is set by a condition outside of the modulus and thickness range according to one or more embodiment of the invention. The First and Second comparative examples each have a thickness less than about 50 μm that is outside of the thickness range of the first functional layer FL1 according to one or more embodiment of the invention, and do not satisfy the modulus range.

In particular, the First comparative example is designed to include the first functional layer FL1 having a thickness of about 40 μm and a modulus of about 6150 MPa under the relatively low temperature (−20° C.) condition, a modulus of about 5500 MPa under the room temperature (25° C.) condition, and a modulus of about 3580 MPa under the relatively high temperature (85° C.) condition. That is, the first functional layer FL1 of the First comparative example has a thickness outside of the thickness range of one or more embodiment of the invention and a modulus outside of the range of the one or more embodiment of the invention.

The Second comparative example is designed to include the first functional layer FL1 having a thickness of about 40 μm and a modulus of about 1470 MPa under the relatively low temperature (−20° C.) condition, a modulus of about 1190 MPa under the room temperature (25° C.) condition, and a modulus of about 940 MPa under the relatively high temperature (85° C.) condition. That is, the first functional

TABLE 2

| | Modulus (MPa) | | | | | |
| --- | --- | --- | --- | --- | --- | --- |
| | Low temperature (−20° C.) | Room temperature (25° C.) | High temperature (85° C.) | Thickness (μm) | Impact resistance (cm) | Bending characteristics |
| Reference embodiment | 7370 | 6790 | 6020 | 50 | 4 | OK |
| First comparative example | 6150 | 5500 | 3580 | 40 | 6 | OK |
| Second comparative example | 1470 | 1190 | 940 | 40 | 6 | OK |
| First embodiment | 1270 | 830 | 350 | 75 | 10 | OK |
| Second embodiment | 1140 | 620 | 110 | 55 | 9 | OK |
| Third comparative example | 1020 | 400 | 110 | 100 | 11 | NG |
| Fourth comparative example | 920 | 211 | 66 | 110 | 10 | NG |
| Fifth comparative example | 950 | 207 | 54 | 100 | 11 | NG |

In Table 2, the impact resistance shows result values of heights generated when an impact is applied to a corresponding structure in a pen drop type examination. The reference embodiment has a laminated structure including the first functional layer FL1 made of a material having a relatively high modulus. In the Reference embodiment, a variation rate of the modulus of the first functional layer FL1 according to temperatures may be relatively smaller than layer FL1 of the Second comparative example has a thickness outside of the thickness range of one or more embodiment of the invention and a modulus out of the range of the one or more embodiment of the invention.

Each of the First and Second comparative examples has improved bending characteristics and a relatively improved impact resistance in comparison with the Reference embodiment. However, each of the First and Second comparative examples has an impact resistance less than about 9 cm. In this case, when the electronic apparatus EA is used by a user, the electronic apparatus EA may be relatively easily damaged by an external impact. The electronic apparatus EA according to one or more embodiment of the invention has an impact resistance of at least about 9 cm or more. Thus, the electronic apparatus EA having improved reliability during usage thereof may be provided.

Each of the First and Second embodiments may include the first functional layer FL1 that satisfies the modulus range and thickness range in one or more embodiment of the invention. In particular, the First embodiment includes the first functional layer FL1 having a thickness of about 75 μm. That is, the first functional layer FL1 of the First embodiment may have a thickness of about 75 μm to about 100 μm and a modulus in a range from about 1000 MPa to about 1800 MPa under the relatively low temperature (−20° C.) condition, a thickness of about 50 μm to about 100 μm and a modulus of about 200 MPa or more under the room temperature (25° C.) condition, and a thickness of about 50 μm to about 75 μm and a modulus of about 100 MPa or more under the relatively high temperature (85° C.) condition. The First embodiment has improved bending characteristics and a relatively high impact resistance to reduce or effectively prevent damage to the electronic apparatus EA even by an impact related to a height of about 9 cm or more. Also, as the first functional layer FL1 of the First embodiment is designed to have a modulus of about 1800 MPa or less under the relatively low temperature condition, degradation in bending characteristics and flexibility due to excessive increase in modulus may be reduced or effectively prevented.

The Second embodiment includes the first functional layer FL1 having a thickness of about 55 μm. That is, the first functional layer FL1 of the Second embodiment satisfies a range of about 1000 MPa or more under the relatively low temperature (−20° C.) condition, a range of about 200 MPa or more under the room temperature (25° C.) condition, and a range of about 100 MPa or more under the relatively high temperature (85° C.) condition. The Second embodiment has improved bending characteristics and an impact resistance of about 5 cm or more in comparison with the Reference embodiment.

The Third to Fifth comparative examples each include the first functional layer FL1 which does not satisfy the above conditions for one or more embodiment of the invention. In particular, the first functional layer of each of the Third comparative example having a thickness of about 100 μm, the Fourth comparative example having a thickness of about 110 μm, and the Fifth comparative example having a thickness of about 100 μm may have a modulus that is outside of a range from about 1000 MPa to 1800 MPa under the relatively low temperature (−20° C.) condition, a range equal to or greater than about 200 MPa under the room temperature (25° C.) condition, and a range equal to or greater than about 150 MPa under the relatively high temperature (85° C.) condition.

As each of the Third to Fifth comparative examples includes the first functional layer FL1 having a thickness relatively greater than that of each of the First and Second comparative examples, each of the Third to Fifth comparative examples has an impact resistance that is improved over that of the Reference embodiment. However, each of the Third to Fifth comparative examples is degraded in bending characteristics. The Third to Fifth comparative examples may improve a protection force of the electronic panel EP with respect to an external impact applied to the electronic apparatus EA, but may be deformed during folding or rolling thereof to become vulnerable to repeated shape deformation of the electronic apparatus EA.

The first and second functional layers FL1 and FL2 may be optically clear. In an embodiment, for example, each of the first and second functional layers FL1 and FL2 may have a visible transmittance of about 90% or more and a haze of about 1% or less. Thus, the image IM displayed by the electronic panel EP may pass through the first and second functional layers FL1 and FL2 and be easily seen from outside the electronic apparatus EA.

Referring to FIGS. 3A and 3B again, each of the first to fourth adhesive layers AS1, AS2, AS3, and AS4 may have an adhesive property and flexibility. In an embodiment, for example, each of the first to fourth adhesive layers may include pressure sensitive adhesive ("PSA").

The first adhesive layer AS1 of the first to fourth adhesive layers AS1, AS2, AS3, and AS4 is disposed between the window WM and the first functional layer FL1 to couple the window WM and the first functional layer FL1 to each other. The second adhesive layer AS2 is disposed between the first functional layer FL1 and the second functional layer FL2 to couple the first functional layer FL1 and the second functional layer FL2 to each other. The third adhesive layer AS3 is disposed between the second functional layer FL2 and the electronic panel EP to couple the second functional layer FL2 and the electronic panel EP to each other.

The fourth adhesive layer AS4 is disposed between the electronic panel EP and the cover panel CP to couple the electronic panel EP and the cover panel CP to each other. In an alternative embodiment, the fourth adhesive layer AS4 may be omitted. Here, the cover panel CP may be directly disposed on the rear surface of the electronic panel EP and closely contact the electronic panel EP. However, the invention is not limited thereto.

The folded electronic apparatus EA-F may be folded about the folding axis FX. Each of the components of the electronic apparatus EA is folded with respect to the folding axis FX. The window WM, which is closest to the folding axis FX along the third direction D3, may be folded at a first curvature radius R1 (e.g., first radius of curvature R1). The first curvature radius R1 may be defined as a distance between a front surface FS of the folded electronic apparatus EA-F at the top surface of the window WM, to the folding axis FX.

The electronic panel EP that is spaced farthest from the folding axis FX along the third direction D3 may be folded at a second curvature radius R2 (e.g., second radius of curvature R2). The second curvature radius R2 may be defined as a distance from the rear surface of the electronic panel EP to the folding axis FX.

In the embodiment, the folding axis FX is defined at the front surface of the window WM (e.g., the front surface FS of the electronic apparatus EA). Thus, the second curvature radius R2 is greater in value than the first curvature radius R1. Each of the first curvature radius R1 and the second curvature radius R2 may be equal to or less than about 2 mm. The electronic apparatus EA having the functional layers FL1 and FL2 disposed between the window WM and the electronic panel EP according to one or more embodiment of the invention may be stably folded even at a micro curvature radius.

As the thickness and modulus of each of the functional layers FL1 and FL2 disposed between the window WM and the electronic panel EP are controlled, the electronic apparatus EA according to one or more embodiment of the invention may have improved rigidity with respect to a folding stress applied thereto and improved impact resistance with respect to an external impact applied thereto.

Figure 5A:
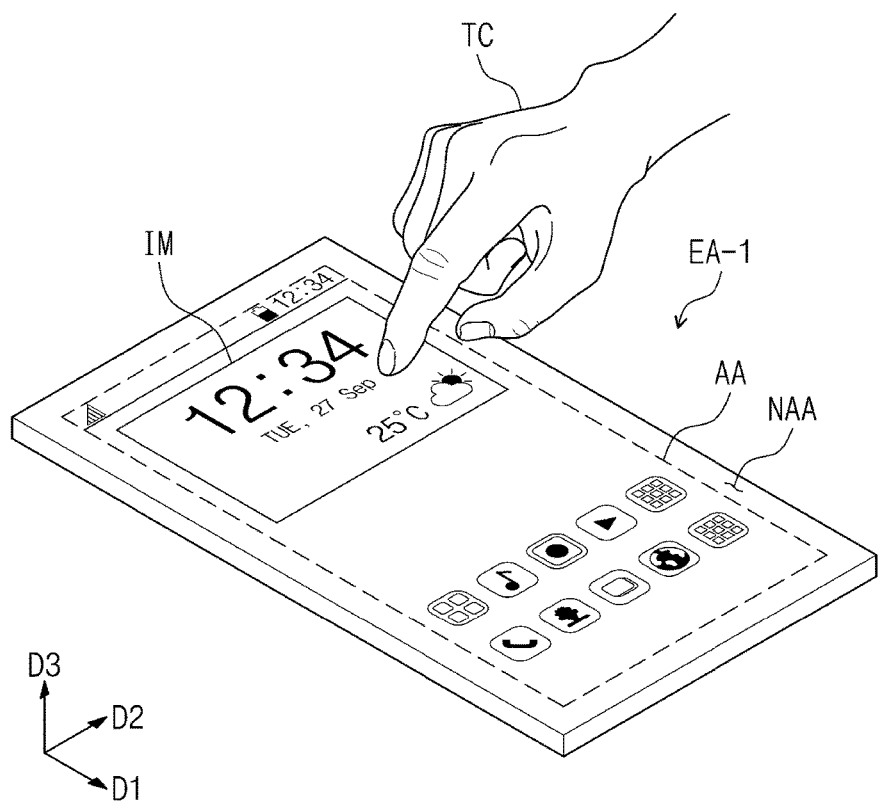
FIG. 5A is a schematic perspective view illustrating still another embodiment of an electronic apparatus.
Figure 5B:
FIG. 5B is a schematic cross-sectional view of the electronic apparatus in FIG. 5A.

FIG. 5A is a schematic perspective view illustrating still another embodiment of an electronic apparatus EA-1. FIG. 5B is a schematic cross-sectional view illustrating the electronic apparatus EA-1 in FIG. 5A. Hereinafter, an embodiment of the invention will be described with reference to FIGS. 5A to 5B.

An electronic apparatus EA-1 in FIGS. 5A and 5B includes components corresponding those of the electronic apparatus EA in FIG. 2A except for an electronic panel EP-1. The same components as those described in FIGS. 1A to 4B are designated by the same reference numerals, and overlapped description will be omitted.

As illustrated in FIG. 5A, the electronic apparatus EA-1 may detect an applied external input TC. Thus, the electronic apparatus EA-1 may display the image IM, which is a function of an output apparatus, and receive the external input TC, which is a function of an input apparatus.

Although a user's hand is illustrated as an example of the external input TC, the external input TC applied from the outside may be provided in various types. In an embodiment, for example, the external input TC may include a force, a pressure and/or light in addition to a contact or proximate location generated by an input object (e.g., a portion of a human body, stylus pen, etc.). However, the invention is not limited thereto.

As illustrated in FIG. 5B, the electronic panel EP-1 may include a display panel DP and a detection panel TP. The display panel DP generates and displays the image IM. The display panel DP may substantially correspond to the electronic panel EP in FIG. 4B. Hereinafter, overlapped description will be omitted.

The detection panel TP may include a sensor for detecting the external input TC. The sensor may include a plurality of conductive patterns. The external input TC may vary a capacitance between the conductive patterns or provide a new capacitance with the conductive patterns. Also, the external input TC may vary resistance of each of the conductive patterns. The detection panel TP may acquire information regarding a position and an intensity of the external input TC through a capacitance or a resistance variation of the sensor.

The detection panel TP may be directly provided on the display panel DP. In an embodiment, for example, the detection panel TP may be directly provided on the encapsulation layer EC (refer to FIG. 4B) of the electronic panel EP. Thus, an additional adhesive member may not be provided between the detection panel TP and the display panel DP.

In the embodiment, the detection panel TP is disposed on the display panel DP to be outside thereof. However, this is exemplarily illustrated. In an embodiment, for example, the detection panel TP may be disposed inside the display panel DP or disposed below the display panel DP.

According to one or more embodiment of the invention, although the electronic panel EP-1 includes various components, the stable foldable electronic apparatus EA-1 may be realized by controlling the thickness and modulus of each of the first functional layer FL1 and the second functional layer FL2.

Figure 6:
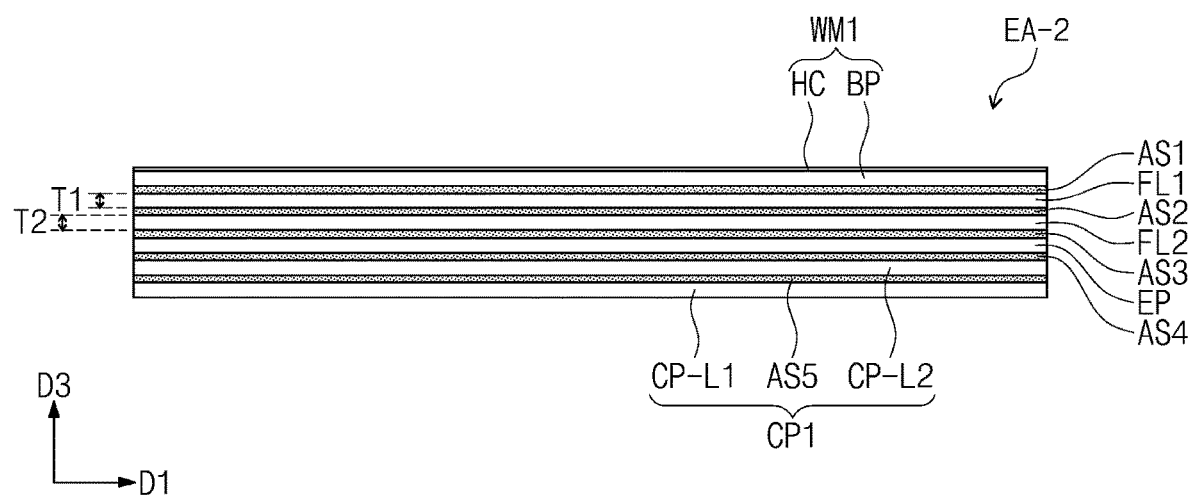
FIG. 6 is a schematic cross-sectional view illustrating yet another embodiment of an electronic apparatus.

FIG. 6 is a schematic cross-sectional view illustrating yet another embodiment of an electronic apparatus. FIG. 6 illustrates a structure corresponding to that in FIG. 3A for easy description. Also, the same components as those described in FIGS. 1A to 5B are designated by the same reference numerals, and overlapped description will be omitted.

As illustrated in FIG. 6, an electronic apparatus EA-2 may include a window WM1 and a cover panel CP1, each of which includes a plurality of layers, in comparison with the electronic apparatus EA in FIG. 3A. The window WM1 may include a base panel BP and a coating layer HC.

The base panel BP may include an insulating material. Also, the base panel BP may be optically clear. In an embodiment, for example, the base panel BP may include a resin film such as polyimide ("PI"). The base panel BP may correspond to the window WM in FIG. 3A.

The coating layer HC contacts the base panel BP to protect the base panel BP. The coating layer HC may be directly provided on the base panel BP. However, the invention is not limited thereto. In an embodiment, for example, although predetermined adhesive may be further provided between the coating layer HC and the base panel BP, the invention is not limited thereto.

The cover panel CP1 may include a first layer CP-L1, a second layer CP-L2, and a fifth adhesive layer AS5. Each of the first layer CP-L1 and the second layer CP-L2 may include a material having a relatively high elasticity or a material having a relatively high modulus. In an embodiment, for example, each of the first layer CP-L1 and the second layer CP-L2 may include an insulating material such as a sponge, rubber, and a resin or metal such as aluminum. The first layer CP-L1 and the second layer CP-L2 may be the same as or different from each other. As the cover panel CP1 further includes the first layer CP-L1 and the second layer CP-L2, the electronic apparatus EA-2 may have improved bending characteristics and an improved impact resistance.

The fifth adhesive layer AS5 is disposed between the first layer CP-L1 and the second layer CP-L2 within the cover panel CP1 to couple the first layer CP-L1 and the second layer CP-L2 to each other. The fifth adhesive layer AS5 may have flexibility to be deformable in correspondence to folding or rolling of the electronic apparatus EA-2. In an embodiment, for example, the fifth adhesive layer AS5 may include pressure sensitive adhesive.

According to one or more embodiment of the invention, although each of the window WM1 and the cover panel CP1 includes a plurality of layers, the electronic apparatus EA-2 having the improved bending characteristics and the improved impact resistance may be provided by controlling the thickness T1 and T2 and modulus of each of the first and second functional layers FL1 and FL2.

According to one or more embodiment of the invention, the flexible laminated structure capable of simultaneously securing flexibility and rigidity may be realized by designing the thickness T1 and T2 and modulus of the plurality of functional layers FL1 and FL2 in a predetermined range. Thus, the electronic apparatus EA that is relieved in stress caused by folding and improved in impact resistance may be provided.

Although the embodiments of the invention have been described, it is understood that the invention should not be limited to these embodiments but various changes and modifications can be made by one ordinary skilled in the art within the spirit and scope of the invention as hereinafter claimed.

Hence, the real protective scope of the invention shall be determined by the technical scope of the accompanying claims.

What is claimed is:

1. An electronic apparatus comprising:
an electronic panel which provides an image and is foldable with respect to a folding axis;
a window which is foldable together with the electronic panel, with respect to the folding axis, and disposed on the electronic panel;
a plurality of functional layers between the electronic panel and the widow, the plurality of functional layers foldable together with the each other and with the window and the electronic panel;
the plurality of functional layers comprising a first functional layer, and a second functional layer which is disposed farther from the window than the first functional layer; and
adhesive layers which respectively couple the window to the first functional layer, and the second functional layer to the first functional layer,
wherein
the modulus of the first functional layer is from 1000 megapascals to 2000 megapascals at a temperature of about −20° C.,
the modulus of the first functional layer is from 200 megapascals to 1000 megapascals at room temperature,
the first functional layer includes any one of polyurethane, silicone, PEBA, and COPE,
the second functional layer which is disposed farther from the window than the first functional layer, has a thickness in a range from 30 micrometers to 0 micrometers together with a modulus in a range from 3 gigapascals to 8 gigapascals, and
the first functional layer has a thickness equal to or greater than that of the second functional layer together with a modulus less than that of the second functional layer.

2. The electronic apparatus of claim 1, wherein
the thickness of the first functional layer is in a range from 50 micrometers to 100 micrometers, and
the modulus of the first functional layer is variable according to temperature.

3. The electronic apparatus of claim 1, wherein the thickness of the first functional layer is in a range from 50 micrometers to 75 micrometers.

4. The electronic apparatus of claim 2, wherein the thickness of the first functional layer is in a range from 75 micrometers to 100 micrometers, and a modulus of the first functional layer is in a range from 1000 megapascals to 1800 megapascals at a temperature of about −20° C.

5. The electronic apparatus of claim 2, wherein the thickness of the first functional layer is in a range from 50 micrometers to 75 micrometers, and the modulus of the first functional layer is 100 megapascals or more at a temperature of about 80° C.

6. The electronic apparatus of claim 2, wherein the thickness of the first functional layer is in a range from 75 micrometers to 100 micrometers, and the modulus of the first functional layer is 150 megapascals or more at a temperature of about 80° C.

7. The electronic apparatus of claim 1, further comprising:
a cover panel facing the window, and
the electronic panel, the first functional layer and the second functional layer between the cover panel and the window which face each other.

8. The electronic apparatus of claim 1, wherein each of the first and second functional layers is optically clear.

9. The electronic apparatus of claim 1, wherein the window comprises glass.

10. The electronic apparatus of claim 9, wherein the window further comprises a coating layer on a top surface of the window.

11. An electronic apparatus comprising:
an electronic panel which provides an image and is foldable with respect to a folding axis;
a window which is foldable together with the electronic panel, with respect to the folding axis;
a plurality of functional layers between the electronic panel and the widow, the plurality of functional layers foldable together with the each other and with the window and the electronic panel;
the plurality of functional layers comprising a first functional layer, and a second functional layer which is disposed farther from the window than the first functional layer; and
adhesive layers which respectively couple the window to the first functional layer, and the second functional layer to the first functional layer,
wherein
the first functional layer has a modulus in a range of 1000 megapascals to 1800 megapascals at a temperature of about −20° C.,
the first functional layer has a modulus in a range of 200 megapascals to 1000 megapascals at room temperature,
the first functional layer includes any one of polyurethane, silicone, PEBA, and COPE, and
the first functional layer has a thickness equal to or greater than a thickness of the second functional layer together with a modulus less than a modulus of the second functional layer.

12. The electronic apparatus of claim 11, wherein the thickness of the second functional layer is in a range from 30 micrometers to 50 micrometers, and the modulus of the second functional layer is in a range from 3 gigapascals to 8 gigapascals.

13. The electronic apparatus of claim 12, wherein the thickness of the first functional layer is in a range from 50 micrometers to 100 micrometers.

14. The electronic apparatus of claim 11, wherein the thickness of the first functional layer is in a range from 50 micrometers to 75 micrometers.

15. The electronic apparatus of claim 14, wherein the modulus of the first functional layer is 100 megapascals or more at a temperature of about 80° C.

16. The electronic apparatus of claim 13, wherein the thickness of the first functional layer is in a range from 75 micrometers to 100 micrometers.

17. The electronic apparatus of claim 16, wherein the modulus of the first functional layer is 150 megapascals or more at a temperature of about 80° C.

18. The electronic apparatus of claim 11, wherein the window comprises glass.

* * * * *